US011271145B2

(12) United States Patent
Fujikawa et al.

(10) Patent No.: US 11,271,145 B2
(45) Date of Patent: Mar. 8, 2022

(54) LIGHT EMITTING DEVICE

(71) Applicant: NICHIA CORPORATION, Anan (JP)

(72) Inventors: Yasuo Fujikawa, Yokohama (JP); Takuya Wasa, Kaifu-gun (JP); Yosuke Nakayama, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/075,272

(22) Filed: Oct. 20, 2020

(65) Prior Publication Data
US 2021/0036201 A1 Feb. 4, 2021

Related U.S. Application Data

(63) Continuation of application No. 16/172,478, filed on Oct. 26, 2018, now Pat. No. 10,847,695, which is a (Continued)

(30) Foreign Application Priority Data

Feb. 27, 2015 (JP) .................. 2015-038647
Feb. 22, 2016 (JP) .................. 2016-031223

(51) Int. Cl.
H01L 33/00 (2010.01)
H01L 33/62 (2010.01)
(Continued)

(52) U.S. Cl.
CPC ............... H01L 33/62 (2013.01); F21K 9/00 (2013.01); H01L 25/0753 (2013.01);
(Continued)

(58) Field of Classification Search
CPC ... H01L 33/62; H01L 25/0753; H01L 27/156; F21K 9/00; H05K 1/141; H05K 3/363;
(Continued)

(56) References Cited

U.S. PATENT DOCUMENTS 5,418,691 A * 5/1995 Tokura .................. H01R 12/62
174/254
5,920,465 A 7/1999 Tanaka
(Continued)

FOREIGN PATENT DOCUMENTS

JP H04-048660 U 4/1992
JP H04-116176 U 10/1992
(Continued)

OTHER PUBLICATIONS

Final Office Action on U.S. Appl. No. 16/172,478 dated Apr. 22, 2020.
(Continued)

Primary Examiner — Shouxiang Hu
(74) Attorney, Agent, or Firm — Foley & Lardner LLP

(57) ABSTRACT

A light emitting device includes: a substrate including: a flexible base member, a first wiring pattern located on the upper surface of the base member, the first wiring pattern including: a first component-side conductive portion, and a second component-side conductive portion, and a plurality of reinforcing lands located on the upper surface of the base member, the plurality of reinforcing lands including: a first reinforcing land, and a second reinforcing land; and a plurality of light emitting elements mounted on the substrate, each light emitting element being electrically connected to the first component-side conductive portion and the second component-side conductive portion.

17 Claims, 9 Drawing Sheets

Related U.S. Application Data continuation of application No. 15/054,697, filed on Feb. 26, 2016, now Pat. No. 10,134,966.

(51) Int. Cl.
  *H05K 1/14* (2006.01)
  *H01L 27/15* (2006.01)
  *F21K 9/00* (2016.01)
  *H01L 25/075* (2006.01)
  *H05K 3/36* (2006.01)
  *F21Y 101/00* (2016.01)
  *F21Y 107/70* (2016.01)
  *F21Y 105/16* (2016.01)
  *F21Y 103/10* (2016.01)
  *F21Y 115/10* (2016.01)
  *H05K 1/11* (2006.01)

(52) U.S. Cl.
  CPC ........... *H01L 27/156* (2013.01); *H05K 1/141* (2013.01); *H05K 3/363* (2013.01); *F21Y 2101/00* (2013.01); *F21Y 2103/10* (2016.08); *F21Y 2105/16* (2016.08); *F21Y 2107/70* (2016.08); *F21Y 2115/10* (2016.08); *H05K 1/118* (2013.01); *H05K 2201/09172* (2013.01); *H05K 2201/09781* (2013.01); *H05K 2201/10106* (2013.01)

(58) Field of Classification Search
  CPC ......... H05K 1/118; H05K 2201/09172; H05K 2201/09781; H05K 2201/10106; F21Y 2101/00; F21Y 2103/10; F21Y 2105/16; F21Y 2107/70; F21Y 2115/10
  See application file for complete search history.

(56) References Cited

U.S. PATENT DOCUMENTS

| | | | |
|---|---|---|---|
| 6,619,831 B2* | 9/2003 | Kanesaka | B60Q 7/00 362/103 |
| 2007/0128893 A1 | 6/2007 | Wu et al. | |
| 2010/0187005 A1 | 7/2010 | Yeh | |
| 2011/0075443 A1 | 3/2011 | Huang et al. | |
| 2012/0169968 A1* | 7/2012 | Ishimori | G02B 6/0073 349/62 |
| 2012/0195024 A1 | 8/2012 | Kawaguchi et al. | |
| 2014/0177220 A1 | 6/2014 | Miyata | |
| 2014/0204309 A1 | 7/2014 | Sakurai et al. | |
| 2016/0295706 A1 | 10/2016 | Jiang | |

FOREIGN PATENT DOCUMENTS

| | | |
|---|---|---|
| JP | 2010-021123 A | 1/2010 |
| JP | 2011-258374 A | 12/2011 |
| JP | 2013-016325 A | 1/2013 |
| JP | 2014-123688 A | 7/2014 |
| WO | WO-2011/045994 A1 | 4/2011 |
| WO | WO-2014/115344 A1 | 7/2014 |

OTHER PUBLICATIONS

Non-Final Office Action on U.S. Appl. No. 16/172,478 dated Oct. 29, 2019.

Notice of Allowance on U.S. Appl. No. 15/054,697 dated Jul. 17, 2018.

Notice of Allowance on U.S. Appl. No. 16/172,478 dated Aug. 19, 2020.

U.S. Office Action on U.S. Appl. No. 15/054,697 dated Jan. 25, 2018.

* cited by examiner

LIGHT EMITTING DEVICE

CROSS-REFERENCE TO RELATED PATENT APPLICATIONS

The present application is a continuation of U.S. patent application Ser. No. 16/172,478, filed on Oct. 26, 2018, which is a continuation of U.S. application Ser. No. 15/054,697, filed Feb. 26, 2016, now U.S. Pat. No. 10,134,966, which claims priority to Japanese Patent Application Nos. 2015-038647, filed on Feb. 27, 2015, and 2016-031223, filed on Feb. 22, 2016, the contents of which are incorporated herein by reference in their entireties.

BACKGROUND

The present disclosure relates to a light emitting device.

Conventionally, a joining component such as a connector is used in joining substrates to each other. For example, JP 2013-016325 A discloses a structure of connecting a plurality of LED substrates and a relay substrate to each other via connectors. WO 2014/115344 discloses a structure in which a base substrate and a relay substrate are connected to each other via connectors and solder. JP 2014-123688 A discloses a light emitting device in which a substrate where a light emitting element is disposed is connected to another substrate by a connection member such as solder.

However, as disclosed in JP 2013-016325 A and WO 2014/115344, in a configuration in which connectors are used for joining substrates to each other, with an increase in the number of portions of the substrates to join, the number of connectors increases, which increases manufacturing cost. Also, a large area is required for disposing the connectors, which decreases the degree of freedom in arrangement of the substrates.

SUMMARY

Accordingly, an object of certain embodiments of the present invention is to provide a light emitting device in which a flexible substrate and another substrate can be connected to each other without using a joining component such as a connector, and thus a reduction in the manufacturing cost can be achieved. In the present disclosure, a configuration that allows connecting a flexible substrate and another substrate without using a joining component may be referred to as a substrate joining structure.

A light emitting device according to certain embodiments of the present disclosure includes a substrate joining structure having a first substrate that includes a flexible first base member and a first wiring pattern provided on the first flexible base member, a second substrate that includes a second base member and a second wiring pattern provided on the second base member, and light emitting elements mounted on the first wiring pattern. A first end of the first substrate overlaps a portion of the second substrate while avoiding the first wiring pattern and the second wiring pattern facing to each other, and a second end of the first substrate does not overlap the second substrate, and an electrically conductive joining member is disposed at positions across the first wiring pattern and the second wiring pattern while covering a portion of the first wiring pattern.

With the light emitting device according to certain embodiments of the present disclosure, a flexible substrate and other substrate can be connected to each other without using joining components such as connectors, and hence the costs associated to the connectors can be reduced. Further, the need of the area for disposing the connectors can be eliminated, so that the degree of freedom in arrangement of the substrates can be improved.

DETAILED DESCRIPTION OF EMBODIMENTS

First Embodiment

Figure 1A:
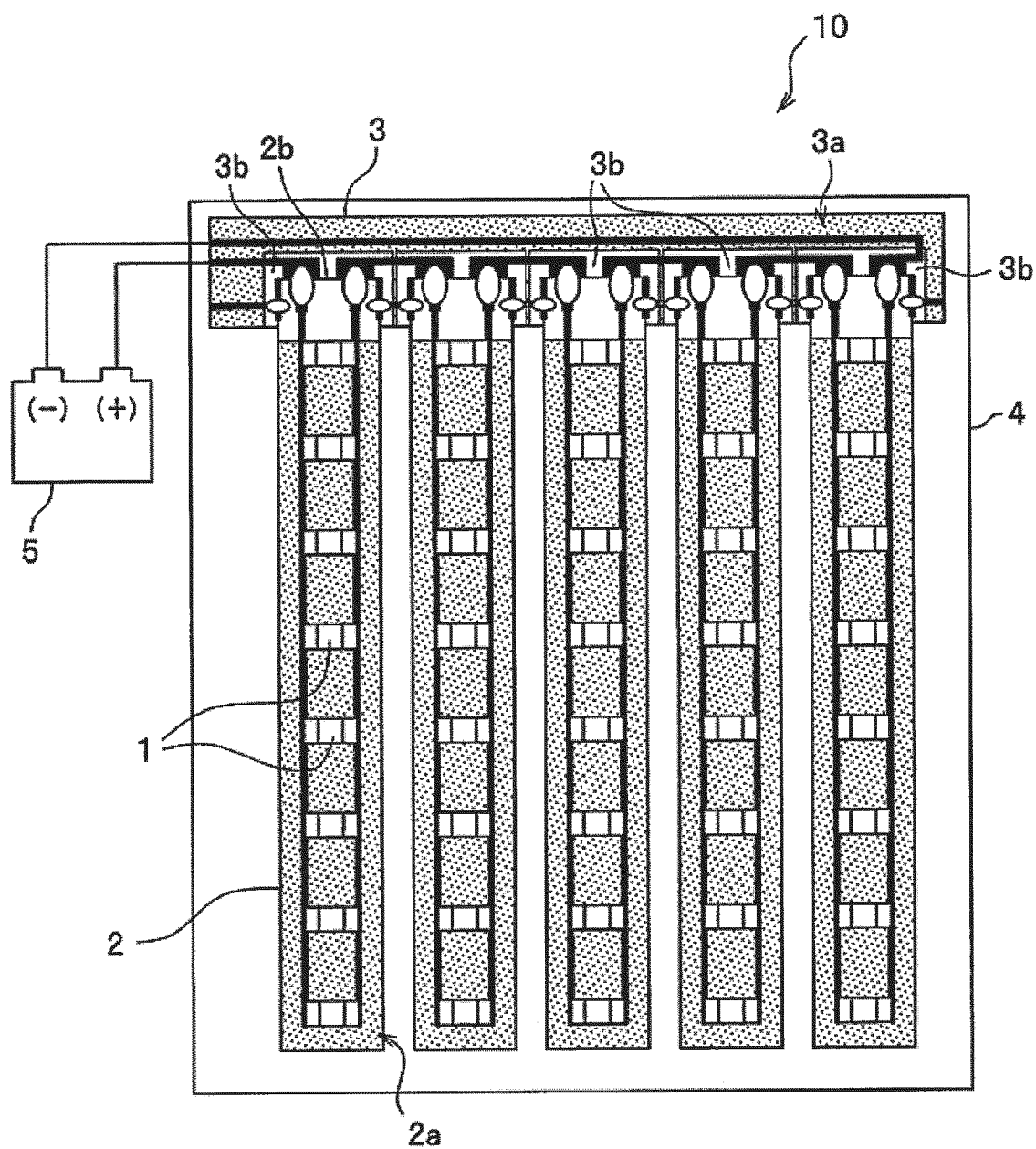
FIG. 1A is a diagram showing a light emitting device according to a first embodiment.

A light emitting device according to a first embodiment will be described. Note that, because the drawings referred to in the following description schematically show the embodiment, the scales, intervals, or positional relationship of the constituents may be exaggerated, or part of the constituent elements may not be shown. Further, between a plan view and a corresponding cross-sectional view, the scale or intervals of the constituent elements may not be common. Still further, in the following description, identical names and reference characters denote identical or similar constituent elements on principle, and detailed descriptions are omitted as appropriate.

Configuration of Light Emitting Device

First, a schematic configuration of a light emitting device according to a first embodiment will be described below with reference to FIGS. 1A and 1B.

FIG. 1A is a diagram showing the light emitting device according to the first embodiment. FIG. 1B is a variation of the first embodiment, showing the state where first substrates and a second substrate are attached to the back surface of a reflecting plate. As shown in FIG. 1A, a light emitting device 10 according to the first embodiment includes a plurality of first substrates 2 (component mounting substrates) on which light emitting elements 1 such as light emitting diodes (LEDs) are mounted, one second substrate 3 (relay substrate) to which a plurality of first substrates 2 are connected and coupled, and a reflecting plate 4 supporting the first substrates 2 and the second substrate 3. Here, the second substrate 3 and the first substrates 2 are connected to the reflecting plate 4 by an adhesive such as a double-sided adhesive tape. Further, the first substrates 2 are each formed in a long and narrow belt shape, and are disposed substantially in parallel to each other in the longitudinal direction. A substrate joining structure included in the light emitting device according to the first embodiment is a structure to connect the first substrates 2 and the second substrate 3, where the first substrates 2 are long flexible substrates on which the light emitting elements 1 are mounted.

Figure 1B:
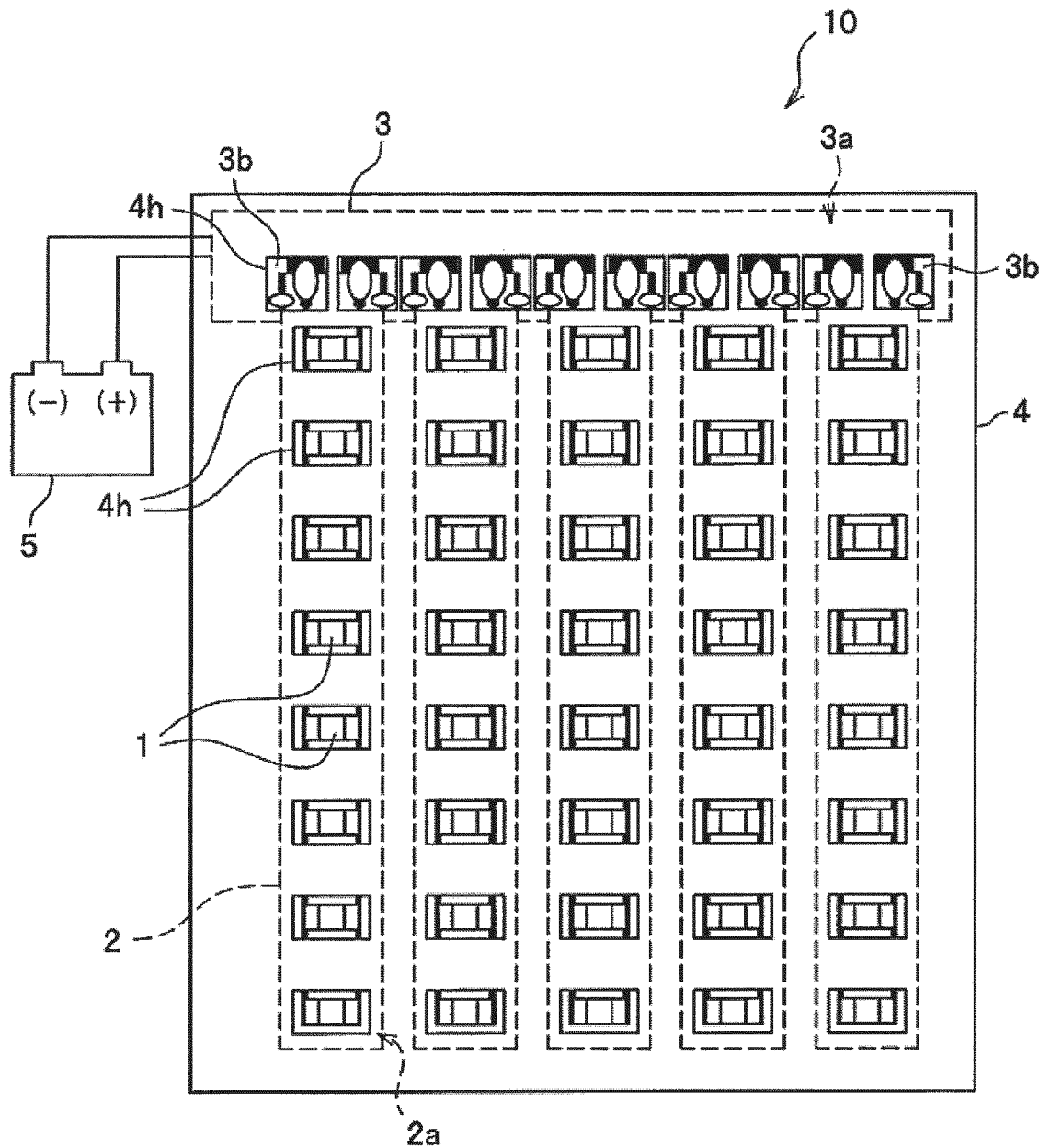
FIG. 1B is a diagram showing a first variation of the first embodiment, in which first substrates and a second substrate are attached to the back surface of a reflecting plate.

Further, as shown in FIG. 1B, the light emitting device 10 may be such that the first substrate 2 and the second substrate 3 are attached on a back surface of the reflecting plate 4. That is, the light emitting device 10 may be configured such that the reflecting plate 4 is attached to the component mounting surfaces 2a side of the first substrates 2 and to the substrate joining surface 3a side of the second substrate 3.

In this case, at the reflecting plate 4, through holes 4h are formed with respective openings at the positions corresponding to the light emitting elements 1 mounted on the first substrates 2 so that the light emitting elements 1 and a joining member (e.g., solder member Hd shown in FIG. 4A) are exposed from the reflecting plate 4. The light emitting device 10 may have a configuration in which the first substrates 2 and the second substrate 3 are attached to (supported by) either the front surface side or the back surface side of the reflecting plate 4.

The first substrates 2 and the second substrate 3 may be a copper foil or an aluminum foil in a long and narrow belt shape, coated by an insulating material. Preferable examples of such an insulating material include polyethylene terephthalate (PET), polyimide, glass epoxy and the like and it is preferable for such a material to be disposed as a thin coating.

The first substrates 2 and the second substrate 3 may be made of different materials, but in the case of employing a same material, properties such as the coefficient of linear expansion can be common, so that distortion at the attached portions due to changes in the temperature or the like can be reduced.

In the example shown in FIG. 1A, the second substrate 3 is disposed at one surface of the reflecting plate 4, but another configuration that can be employed in the light emitting device 10 is one in which the second substrate 3, having a plurality of first substrates 2 connected thereto, is disposed at each of the opposite surfaces of the reflecting plate 4. In this case, the two second substrates 3 may be electrically connected either in series or in parallel.

Configuration of First Substrate (Component Mounting Substrate)

Figure 2:
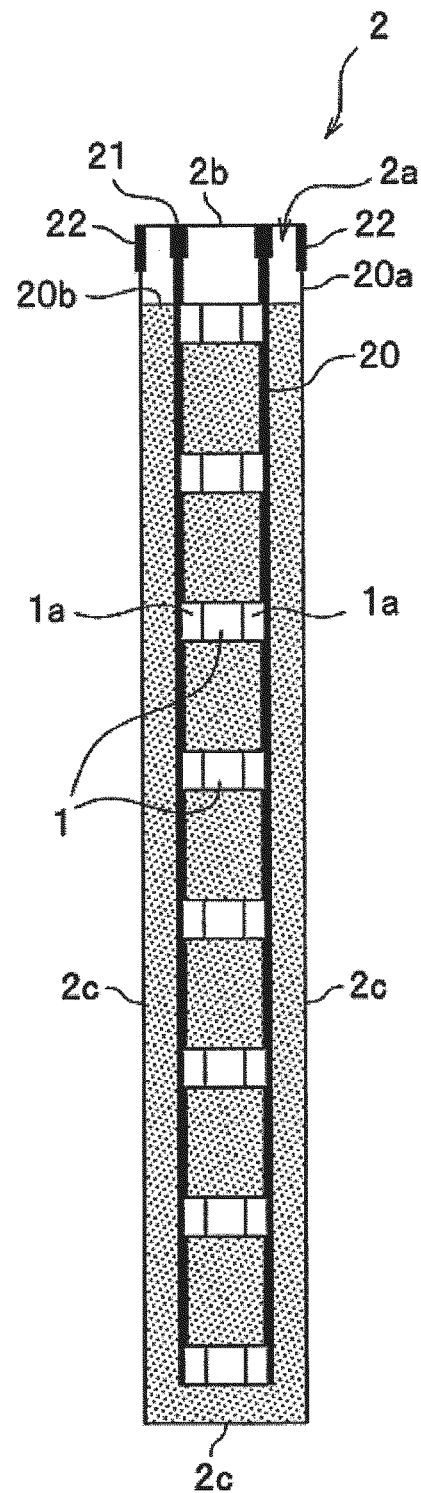
FIG. 2 is a schematic plan view of a first substrate in a light emitting device according to the first embodiment.

FIG. 2 is a plan view of a single first substrate used in a light emitting device according to the first embodiment. As shown in FIG. 2, the first substrate 2 is a substrate for mounting components such as the light emitting elements 1. The first substrate 2 is a flexible substrate having flexibility (pliability). The first substrate 2 is a flexible substrate having a configuration, for example, a flexible first base member 20a such as a polyimide base member or a glass epoxy base member, and component-side conductive portions 20 (first wiring patterns) each made of an electrically conductive material such as a copper foil, are disposed on the first base member 20a in a shape of printed wiring or the like. The component-side conductive portions 20 are wiring portions to which the light emitting elements 1 (mounting components) are electrically connected. The component-side conductive portions 20 are formed on one surface of the first base member 20a to provide a component mounting surface 2a of the first substrate 2. On the component mounting surface 2a of the first substrate 2, the light emitting elements 1 are mounted in a row spaced apart from each other at a predetermined interval in the longitudinal direction.

On the component mounting surface 2a of the first substrate 2, a first insulating film 20b made of an insulating material is disposed. It is preferable that, with the use of an insulating film 20b such as a white resist having an optical reflectance higher than that of the first base member 20a, the light reflectivity of the first substrate can be improved and thus the brightness of the light emitting device can be improved. The first insulating film 20b covers the component mounting surface 2a such that portions of the component-side conductive portions 20 are exposed at a joining end portion 2b (see FIG. 4B) near a first end side (a short side) in the longitudinal direction of the first substrate 2 over the second substrate 3.

At the joining end portion 2b of the first substrate 2, the first base member 20a and the component-side conductive portions 20 are exposed outside the first insulating film 20b to soldering. The first wiring pattern may include first conductive lands 21 where the widths of the component-side conductive portions 20 are partially increased near the first end at the joining end portion 2b. With this configuration, a sufficient area for soldering can be secured at the first conductive lands 21, so that stronger connection strength can be obtained. In the case where a sufficient area for soldering can be secured without specifically changing the widths of the component-side conductive portions 20 near the first end at the joining end portion 2b, the component-side conductive portions 20 at the joining end portion 2b can be used as the first conductive lands 21 without changing the widths. Also, the component-side conductive portions 20 are preferably provided along the longitudinal direction to the first end (the short side) at the component mounting surface 2a of the first substrate 2, but may be provided onto the joining end portion 2b.

In the present embodiment, the first conductive lands 21 have a substantially rectangular shape, but any appropriate shape can be employed. For example, the first energized lands 21 may each have a shape other than a substantially rectangular shape, such as a circler shape or an elliptical shape.

Further, on the first base member 20a of the first substrate 2, at the joining end portion 2b, first reinforcing lands 22 that are electrically insulated from the first conductive lands 21 are formed. The first reinforcing lands 22 are also formed at positions electrically insulated from the component-side conductive portions 20. For example, the first reinforcing lands 22 are provided at both sides of the joining end portion 2b along the longitudinal sides that extend from the first end (the short side) of the first substrate 2, respectively closer to the corresponding longitudinal side than the corresponding component-side conductive portion 20 and spaced apart from the component-side conductive portions 20. In the present embodiment, of the outer edges of the first substrate 2 in a plan view, outer edges other than the outer edges of the joining end portion 2b are referred to as second ends 2c, as shown in FIG. 2. The first reinforcing lands 22 are regions that allow soldering, and made of, for example an electrically conductive member such as a copper foil, similarly to the component-side conductive portions 20. In one example shown in FIG. 2, two first reinforcing lands 22 are formed on one first substrate 2. An appropriate number of first reinforcing lands 22 can be disposed on one first substrate 2. It is preferable that the first reinforcing lands 22 are disposed so as to reach the corresponding longitudinal sides that are extending from the respective ends of the first end (the short side).

A plurality of light emitting elements 1 are mounted in a row on the component mounting surface 2a of the first substrate 2 at a predetermined interval. Each light emitting element 1 has electrodes 1a. The electrodes 1a of each light emitting element 1 are connected to the component-side conductive portions 20 via, for example, an anisotropic electrically conductive member or solder member. The light emitting elements 1 of either a same emission color or different emission colors can be used, and mounted according to the purpose of the light emitting device 10 (see FIG. 1A).

Configuration of Second Substrate (Relay Substrate)

Figure 3:
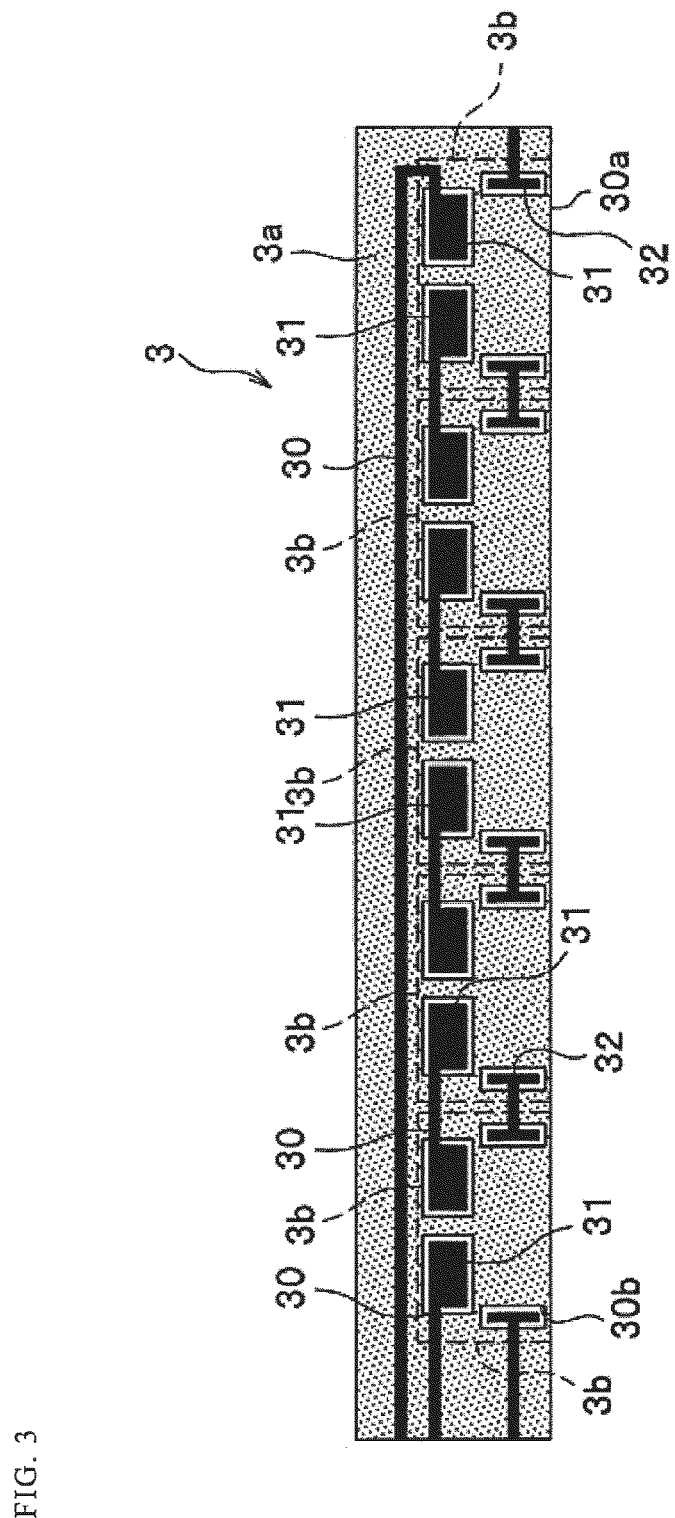
FIG. 3 is a schematic plan view of a second substrate in a light emitting device according to the first embodiment.

FIG. 3 is a plan view of the second substrate used in the light emitting device according to the first embodiment. As shown in FIG. 3, the second substrate 3 is a substrate for connecting a plurality of first substrates 2. The second substrate 3 is a flexible substrate formed similarly to the first substrate 2 shown in FIG. 2, and relay-side conductive members 30 (second wiring patterns) are formed on an upper surface of the second base member 30a by using an electrically conductive material such as a copper foil. In the first embodiment, the upper surface of the second base member 30a where the relay-side conductive members 30 are formed is used as a substrate joining surface 3a of the second substrate 3, and the relay-side conductive members 30 are formed on the second substrate 3 at positions corresponding to the component-side conductive portions 20 of the first substrates 2 so as to establish connection therebetween. Further, a plurality of joining regions 3b are formed on the second substrate 3 so that each of the first substrates 2 is disposed facing the corresponding second substrate 3, and the relay-side conductive members 30 are arranged extending into the respective joining regions on the second substrate 3. Further, at each of the joining regions 3b, second reinforcing lands 32 are formed. Note that, in the second substrate 3, as one example, in the case where a plurality of first substrates 2 are connected in series, the relay-side conductive members 30 are formed in series.

Further, in the second substrate 3, the substrate joining surface 3a is mainly coated by a second insulating film 30b (white resist or the like) made of an insulating material. It is preferable that, with the use of an insulating material (such as a white resist) having an optical reflectance higher than that of the second base member 20a, the light reflectivity of the first substrate can be improved and thus the brightness of the light emitting device can be improved. At the joining end portion 3b, the relay-side conductive members 30 and the second reinforcing lands 32 are exposed outside the second insulating film 30b to enable soldering. Also, in the joining regions 3b, end portions of the relay-side conductive members 30 are extend in a substantially rectangular shape to form the second conductive lands 31 that together with the relay-side conductive members serve as the second wiring pattern. With this arrangement, sufficient areas for soldering can be secured in the second conductive lands 31 and thus, the adhesion strength at the area can be improved. In the case where the sufficient areas for soldering can be secured without specifically changing the width of the end portions of the relay-side conductive portions 30, the relay-side conductive members 30 in the joining regions 3b can be used as the second conductive lands 31. In the present embodiment, the joining regions 3b are substantially rectangular regions so that the first substrate 2 can be overlapped.

The second conductive lands 31 are formed on the joining regions 3b at positions that allows soldering to the first conductive land at the joining end portion 2b of the first substrate 2 corresponding joining regions 3b. In the first embodiment, a plurality of second conductive lands 31 are disposed at predetermined intervals in a straight orientation, and the relay-side conductive members 30 are disposed also in a straight orientation to electrically connect the conductive lands 31 of adjacent two joining regions 3b. The relay-side conductive members 30 that are connected to a power supply 5 (see FIG. 1A) are electrically connected to the second conductive lands 31 proximate to the longitudinal ends portions.

The second conductive lands 31 are formed to have a larger area than that of the first conductive lands 21 (see FIG. 2) formed on the first substrate 2. The second conductive lands 31 corresponding to the number of the first substrates 2 (see FIG. 2) connected to the second substrate 3 are formed. For example, in the case where five first substrates 2 each having two first conductive lands 21 are connected to the second substrate 3, ten (two for each of the five first substrates 2) of the second conductive lands 31, which is the same number as the first conductive lands 21 that are formed on the first substrate 2, are formed on the second substrate 3.

Further, each joining region 3b on the second substrate 3 is provided with the second reinforcing lands 32 formed respectively at positions that allow soldering to connect with the corresponding first reinforcing lands 22 that are located at the joining end portion 2b of the first substrate 2. The second reinforcing lands 32 are arranged on the second substrate 3 so that portions of the second reinforcing lands 32 are arranged substantially in a straight line and across two adjacent joining regions 3b, and portions of the second reinforcing lands 32 are spaced apart from each other with respective sides of their longitudinal ends being arranged on substantially straight lines. On the second base member 30a, the second reinforcing lands 32 are spaced apart from and also electrically insulated from the second conductive lands 31 and the relay-side conductive members 30 on the second base member 30a. The second reinforcing lands 32 are region that allow soldering, and in the first embodiment, for example, respectively formed in a T-shape. The second reinforcing lands of adjacent two joining regions 3b may be connected by a portion of the reinforcing land 32. The second reinforcing lands 32 are each made of an electrically conductive material such as a copper foil, similarly to the relay-side conductive members 30.

The second reinforcing lands 32 are formed to be partially exposed outside the first substrates 2 when the first substrates 2 (see FIG. 2) are overlapped. In the first embodiment, the second reinforcing lands 32 respectively include the straight line portions that are substantially in parallel to the relay-side conductive members 30, formed to be exposed outside the first substrates 2 when the first substrates 2 are overlapped.

Configuration of Substrate Joining Structure

Figure 4A:
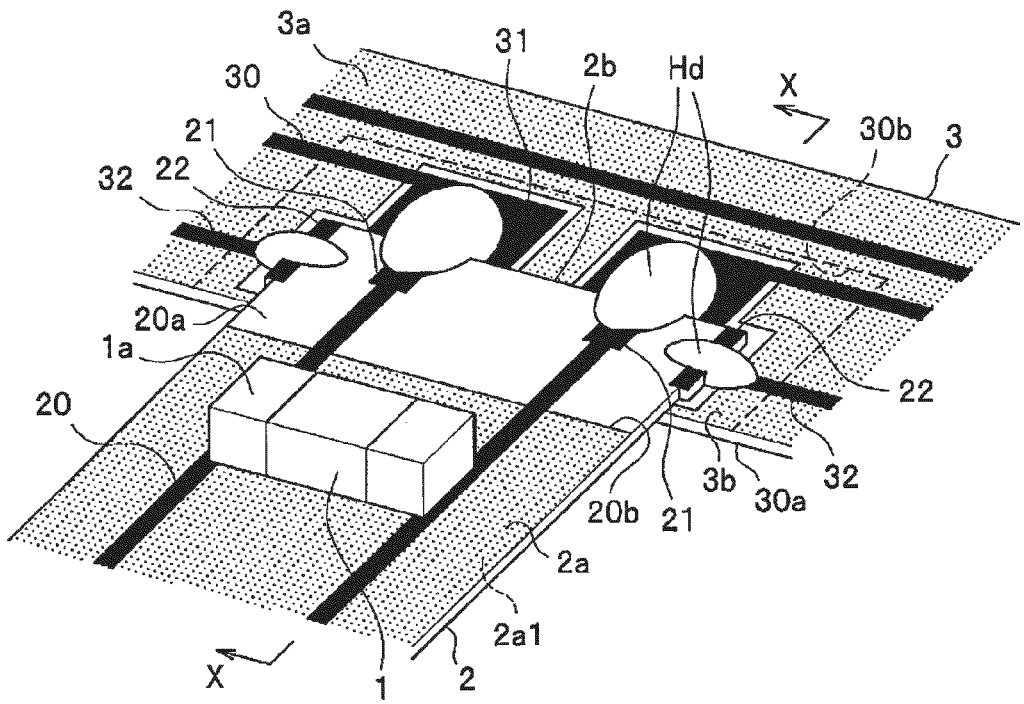
FIG. 4A is a schematic perspective view of a substrate joining structure in a light emitting device according to the first embodiment.
Figure 4B:
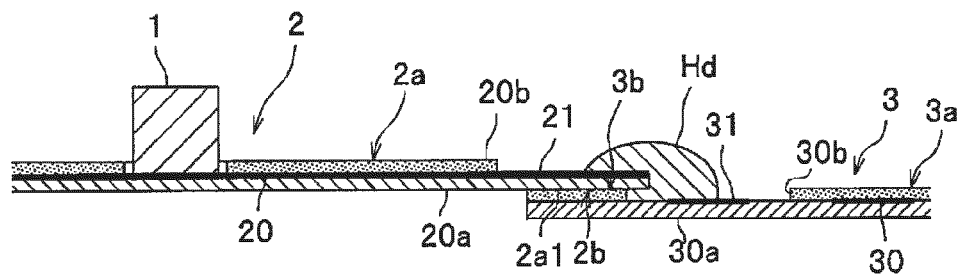
FIG. 4B is a schematic cross-sectional view taken along line X-X in FIG. 4A.
Figure 4C:
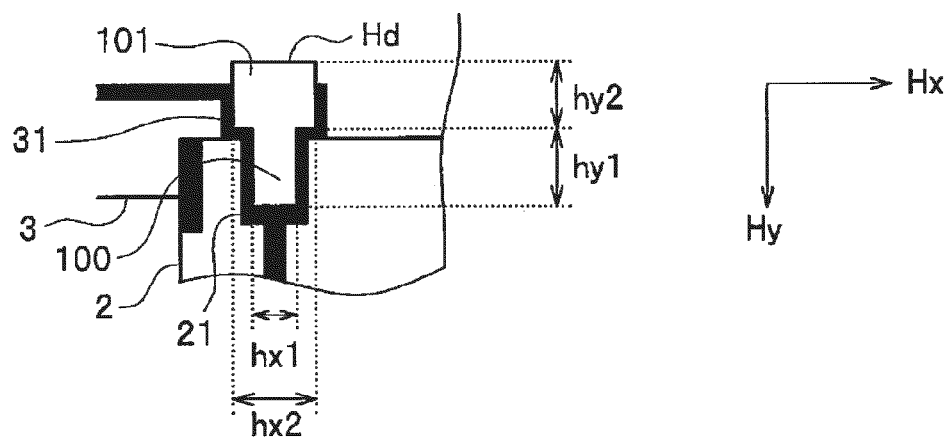
FIG. 4C is a diagram showing a shape of a solder member that connects a first conductive land and a second conductive land.

FIG. 4A is a schematic perspective view of the substrate joining structure in the light emitting device according to the first embodiment. FIG. 4B is a schematic cross-sectional view taken along line X-X in FIG. 4A. FIG. 4C is a diagram showing the shape of the solder member connecting between the first conductive land and the second conductive land. As shown in FIGS. 4A and 4B, in the substrate joining structure in the light emitting device according to the first embodiment, the first substrates 2 and the second substrate 3 are connected via a joining member. In the substrate joining structure, the joining end portion 2b of each first substrate 2 is overlapped on the corresponding joining region 3b of the substrate joining surface 3a of the second substrate 3. Then, in the state where the first substrates 2 are overlapped on the second substrate 3 while having their back surfaces 2a1 (the back surfaces of the component mounting surfaces 2a) facing the corresponding joining regions 3b, the first substrates 2 are connected to the second substrate 3 by joining the first conductive lands 21 and the second conductive lands 31 using an electrically conductive joining member (e.g., the solder member Hd).

In the substrate joining structure, solder member Hd is applied across the first conductive lands 21 (the first wiring patterns) and the corresponding second conductive lands 31 (the second wiring patterns) respectively so that respective portions of the joining end portion 2b (the first end portion) are covered by the solder member Hd. Thus, the first conductive lands 21 and the second conductive lands 31 are soldered to each other.

In the case where the first conductive lands 21 are not extended to the distal ends of the joining end portions 2b and provided in close proximity to the distal ends of the joining end portions 2b, the first conductive lands 21 are provided at the positions that allow the solder member Hd to cover a portion of each of the joining end portions 2b. In the case where the first reinforcing lands 22 are not extended to the distal ends of the first substrates 2 and the first reinforcing lands 22 are provided in close proximity to the distal ends, the first reinforcing lands 22 are provided at the positions that allow the solder member Hd to cover a portion of each of the end portions.

The two first conductive lands 21 of one first substrate 2 respectively correspond to the electrodes (i.e., the positive electrode and the negative electrode) of the light emitting element 1, and are joined to the first conductive lands 21 and the second conductive lands 31 of corresponding positive or negative side by solder member Hd. The solder is applied to the first conductive land 21 and the second conductive land 31 so that short circuit does not occur between the two conductive lands of a single first substrate 2. For example, the solder is applied so as not to form a solder bridge between the two conductive lands 21 provided to one first substrate 2. Thus, the first conductive lands 21 and the second conductive lands 31 are soldered respectively.

Further, in the substrate joining structure, the reinforcing-purpose joining member (the solder member Hd in the first embodiment) is disposed on the respective portions so as to cover at least part of the end portions of each first substrate 2 (the second end portions 2c that are different from the first end portion that serves as the joining end portion 2b) and across the first reinforcing land 22 on the component mounting surface 2a of the first substrate 2 and the second reinforcing land 32 on the joining region 3b of the second substrate 3. Thus, each of the first reinforcing lands 22 and the corresponding second reinforcing land 32 is connected to each other. The second conductive lands 31 and the second reinforcing lands 32 of the second substrate 3 include the portions positioned outside the first substrates 2 when the first substrates 2 are overlaid, so that connection by the solder member Hd can be ensured.

Figure 9A:
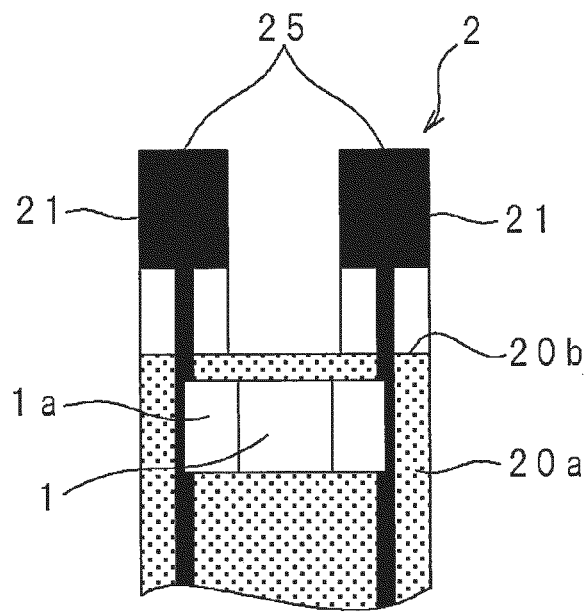
FIG. 9A is a schematic plan view showing a portion of a first substrate proximate to a first end of a first substrate used in a light emitting device according to a second variation of the first embodiment.
Figure 9B:
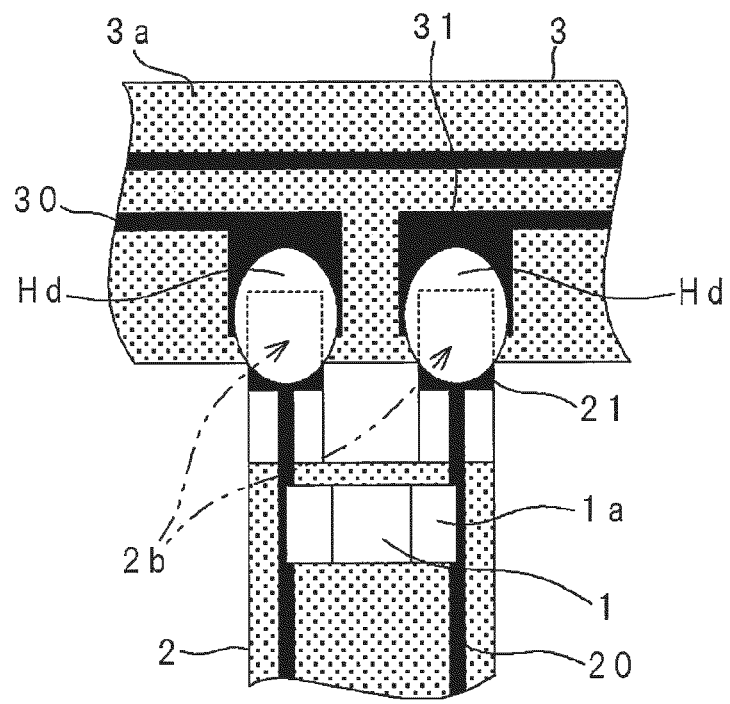
FIG. 9B is a diagram of a substrate joining structure included in a light emitting device according to the second variation of the first embodiment, showing a schematic plan view of a state of an electrically conductive joining member covering substantially entire surfaces of joining end portion.

FIG. 9A is a schematic plan view showing a portion of a first substrate proximate to a first end of a first substrate used in a light emitting device according to a second variation of the first embodiment. FIG. 9B is a diagram of a substrate joining structure included in a light emitting device according to the second variation of the first embodiment, showing a schematic plan view of a state of an electrically conductive joining member covering substantially entire upper surfaces of joining end portion. As shown in FIG. 9A, in a plan view, the portion proximate to the first end of the first substrate may have a shape with a recessed portion at the center of the first end side. That is, the portion of the first substrate proximate to the first end has two extended portions 25. The two first electrically conductive lands 21 provided to a single first substrate 2 are respectively formed on the two extended portions 25, so that the two first electrically conductive lands 21 are spaced apart from each other. In this case, as shown in FIG. 9B, the two extended portions 25 of the first substrate respectively overlap the second substrate 3, so that the joining end portion 2b has two separate portions. With this arrangement, even in the case where the electrically conductive joining member is disposed to cover entire upper surfaces of the two portions of the joining end portion 2b, the two first electrically conductive lands 21 provided to a single first substrate 2 are not short-circuited with each other.

In the present embodiment, it is preferable that each of the first substrates 2 has the first base member 20a with a thickness in a range of 3 μm to 450 μm, and the copper foil applied as the component-side conductive portions 20, the first conductive lands 21 and the first reinforcing lands 22 respectively have a thickness in a range of 15 μm to 40 μm. Further, it is preferable that the first substrates 2 that are flexible substrates respectively have a thickness in a range of 20 μm to 500 μm.

For example, the first substrate 2 may have the first base member 20a with a thickness of about 200 μm, and a copper foil with a thickness of about 35 μm as the component-side conductive portions 20 or the like applied on each of the opposite surfaces of the first base member 20a. Such a first substrate 2 has a total thickness of about 270 μm and can be determined as a standard of the flexible first substrate 2. Further, the first substrate 2 may have the first base member 20a with a thickness of 5 μm, and a copper foil with a thickness of 18 μm as the component-side conductive portions 20 or the like applied on the opposite surface of the first base member 20a. Such a first substrate 2 has a total thickness of 23 μm and can be determined as the flexible first substrate 2 of a smallest thickness. On the other hand, the first substrate 2 may have the first base member 20a with a thickness of 400 μm, and a copper foil with a thickness of about 35 μm as the component-side conductive portions 20 or the like applied on each of the opposite surfaces of the first base member 20a. Such a first substrate 2 has a total thickness of about 470 μm and can be determined as the flexible first substrate 2 of a largest thickness.

With the first substrates 2 having such a thickness, the first conductive lands 21 and the second conductive lands 31, and the first reinforcing lands 22 and the second reinforcing lands 32 can be effectively soldered to each other without cracking the solder member Hd.

Further, the solder member Hd is preferably applied in a shape as shown in FIG. 4C to connect the first conductive land 21 and the second conductive land 31. As shown in FIG. 4C, the solder member Hd has a longitudinally extending portion 100 and the laterally extending portion 101. The longitudinally extending portion 100 is a portion connected to the first conductive land 21 and extended in the extending direction of the first substrate 2. The laterally extending portion 101 is a portion connected to the second conductive land 31 and extended in the extending direction of the second substrate 3. In the shape of the solder member Hd, for the sake of convenience, the extending direction of the first substrate 2 is referred to as the longitudinal direction Hy, and the extending direction of the second substrate 3 is referred to as the lateral direction Hx.

In this case, the solder member Hd preferably has a longitudinally extending portion 100 with a lateral length hx1 in a range of 0.5 mm to 3.0 mm, and a laterally extending portion 101 with a lateral length hx2 in a range of 0.5 mm to 5.0 mm. It is also preferable that the longitudinal portion has a longitudinal length hy1 in a range of 0.5 mm to 5.0 mm and the laterally extending portion 101 has a longitudinal direction hy2 in a range of 0.5 mm to 5.0 mm.

In the case of the solder member Hd having the longitudinally extending portion 100 and the laterally extending portion 101 with a dimension or dimensions (i.e., the length in the longitudinal direction and/or the lateral direction) greater than that described above, cracks tend to occur in the solder member Hd. In the case of the solder member Hd having the longitudinally extending portion 100 and the laterally extending portion 101 with a dimension or dimensions (i.e., the length in the longitudinal direction and/or the lateral direction) smaller than that described above, handleability may decrease. In order to prevent the solder member Hd from cracking and maintain handleability, the longitudinally extending portion 100 and the laterally extending portion 101 of the solder member Hd preferably have dimensions (i.e., the length in the longitudinal direction and/or the length in the lateral direction) in the range discussed above.

In the substrate joining structure, the first base member 20a is between the component-side conductive portions 20 provided at the component mounting surface 2a of each first substrate 2 and the relay-side conductive members 30 provided at the substrate joining surface 3a of the second substrate 3. Also, in the substrate joining structure, the joining end portion 2b of the first substrate 2 is overlapped on the joining region 3b of the second substrate 3 and connected thereto such that the component-side conductive portions 21 and the relay-side conductive member 31 are not connected facing each other. Note that, in the present embodiment, the entire first substrate 2 is disposed such that all the portions except for the joining end portion 2b do not overlap the second substrate 3.

In the substrate joining structure, the second insulating film 30b is interposed between the first base member 20a of each first substrate 2 and the second base member 30a of the second substrate 3. But, the first substrate 2 and the second substrate 3 (the second base member 30a) may be brought into contact (surface contact) with each other having none of other members such as the second insulating film 30b interposed. That is, the second insulating film 30b may not be provided to the portion of the second substrate 3 where the first substrate 2 overlaps (i.e., the joining region 3b). In this case, the thickness of the connecting portion of the first substrate 2 and the second substrate 3 can be reduced.

Note that, in the case where the reinforcing joining member that connects the first reinforcing land 22 and the second reinforcing land 32 is the solder member Hd, the first reinforcing land 22 and the second reinforcing land 32 can be connected in the same operation of connecting the first conductive land 21 and the second conductive land 31 by the solder member Hd, so that the work efficiency of connecting the first substrates 2 and the second substrate 3 can be improved. Further, for the reinforcing joining member, an appropriate member other than the solder member Hd can be also used. For example, an electrically conductive adhesive agent may be used in connecting the first reinforcing land 22 and the second reinforcing land 32. For the reinforcing joining member to connect the first reinforcing land 22 and the second reinforcing land 32, a non-electroconductive material can also be used.

As described above, according to the first embodiment, the first substrates 2 and the second substrate 3 can be connected to each other without the necessity of using joining components such as a connector. That is, the substrate joining structure in the light emitting device according to the first embodiment can serve equivalently as a structure in which the first substrate 2 and the second substrate 3 are connected to each other with the use of a joining component such as a connectors, it does not require the joining components such as connectors, and the costs relating to the joining components such as connectors can be eliminated. Further, since the space in which the joining components such as connectors are disposed is not required, the flexibility in disposing the first substrates 2 and the second substrate 3 (the substrate layout) improves.

Further, with the substrate joining structure included in the light emitting device according to the first embodiment, the first reinforcing lands 22 on the component mounting surface 2a of each first substrate 2 and the second reinforcing lands 32 on the substrate joining surface 3a of the second substrate 3 are connected by the reinforcing-purpose joining member. Accordingly, with the substrate joining structure according to the first embodiment, the first substrates 2 and the second substrate 3 are firmly connected to each other, and the joining strength between the first substrates 2 and the second substrate 3 improves.

Still further, with the substrate joining structure according to the first embodiment, the first substrates 2 overlaps the second substrate 3 such that the component-side conductive portions 20 provided at the first base member 20a of each first substrate 2 and the relay-side conductive members 30 provided at the second base member 30a of the second substrate 3 do not oppose to each other. Accordingly, as shown in FIG. 4A, the first conductive lands 21 and the second conductive lands 31 are oriented in the same direction. Therefore, the work of dispensing the solder member Hd across the first conductive lands 21 and their corresponding second conductive lands 31 can be facilitated. Similarly, the first reinforcing lands 22 and the second reinforcing lands 32 are oriented in the same direction, so that the work of dispensing the solder member Hd across the first reinforcing lands 22 and the second reinforcing lands 32 can be facilitated.

In the substrate joining structure used in the light emitting device according to the first embodiment, the first reinforcing lands 22 are formed on the first substrates 2, and the second reinforcing lands 32 are formed on the second substrate 3. But, the substrate joining structure may be formed without the first reinforcing lands 22 and the second reinforcing lands 32. In this case, the first substrate 2 and the second substrate 3 are connected to each other at the first conductive lands 21 and the second conductive lands 31, respectively.

Second Embodiment

Figure 5:
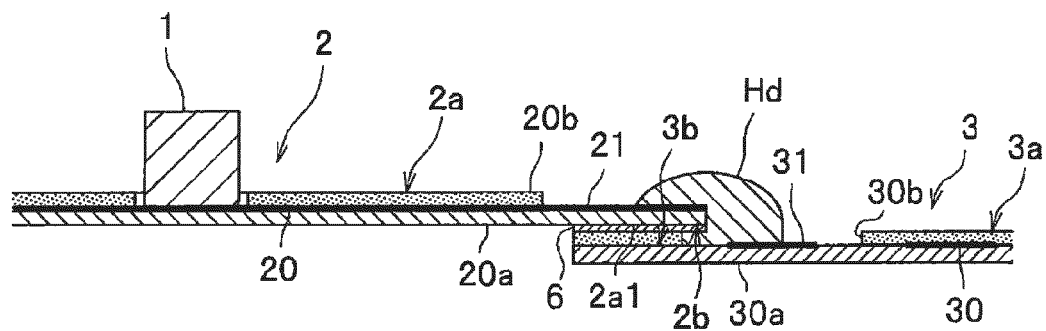
FIG. 5 is a diagram of light emitting device according to a second embodiment, showing a schematic cross-sectional view of a state of a substrate joining structure, in which a first substrate is connected to a second substrate via an adhesive member.

FIG. 5 is a diagram of a substrate joining structure in a light emitting device according to a second embodiment, showing a schematic cross-sectional view of a state where the first substrate is adhered to the second substrate via an adhesive member. Note that, in the description of the second embodiment, constituent components that are the same or similar to those of the substrate joining structure included in the light emitting device according to the first embodiment are denoted by the same reference numerals, and detailed descriptions thereof will be omitted.

In the first embodiment, as shown in FIG. 4B, the joining end portion 2b of the first substrate 2 is arranged overlapping the substrate joining surface 3a of the second substrate 3. At this time, the first substrate 2 and the second substrate 3 overlap with each other, with the back surface 2a1 of the first substrate 2 overlapping the substrate joining surface 3a. As a substrate joining structure included in the second embodiment, as shown in FIG. 5, the first substrate 2 may overlap the second substrate 3 (the substrate joining surface 3a) via an adhesive member 6 such as a double-sided tape. That is, the substrate joining structure may be such that, the back surface 2a1 of the first base member 20a of the first substrate 2 overlaps the substrate joining surface 3a of the second base member 30a of the second substrate 3 via the adhesive member 6 such as a double-sided tape, and thus the first substrate 2 and the second substrate 3 are adhered to each other by the adhesive member 6. In this case, the first substrate 2 and the second substrate 3 are fixed to each other also by the adhesive member 6 in addition to the solder, the first substrate 2 and the second substrate 3 can be more firmly connected to each other, and the connection strength between the first substrates 2 and the second substrate 3 can be enhanced. Note that, an appropriate adhesive member 6 other than the double-sided tape can also be used. An adhesive agent may be used as the adhesive member 6.

Moreover, at the portion where the first substrate 2 overlaps the second substrate 3, an adhesive agent may be applied along the end portion of the second substrate 3. That is, the back surface 2a1 of the first substrate 2 and the end portion of the second substrate 3 may be fixed to each other and reinforced by an adhesive agent. Further, at the portion where the first substrate 2 overlaps the second substrate 3, a cover tape may be attached across the end portion of the second substrate 3 and the back surface 2a1 of the first substrate 2. That is, the back surface 2a1 of the first substrate 2 and the end portion of the second substrate 3 may be fixed to each other and reinforced by a cover tape.

The substrate joining structure included in the light emitting device according to the second embodiment may not include the first reinforcing lands 22 and the second reinforcing lands 32. Even with this structure, the first substrate 2 and the second substrate 3 are firmly fixed to each other by the adhesive member 6.

Third Embodiment

Figure 6:
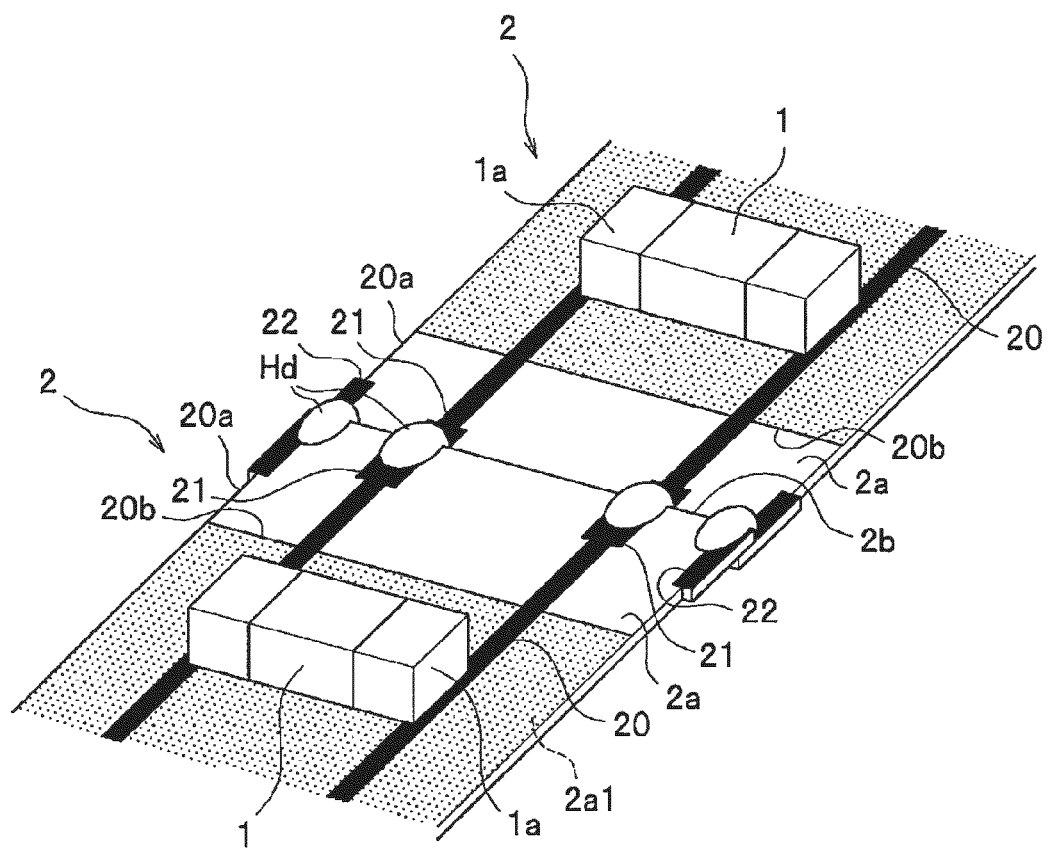
FIG. 6 is a diagram of light emitting device according to a third embodiment, showing a schematic perspective view of a state of a substrate joining structure, in which a long first substrate is added.

FIG. 6 is a diagram of a light emitting device according to a third embodiment, showing a schematic perspective view of a state of a substrate joining structure, in which a long first substrate is added. Note that, in the description of the third embodiment, constituent components that are the same or similar to those of the substrate joining structure according to the first embodiment are denoted by the same reference numerals, and detailed descriptions thereof will be omitted. As shown in FIG. 6, as the third embodiment, the first substrates 2 can be connected to each other by the substrate joining structure. That is, the first substrate 2 can be additionally connected to the first substrate 2 with the use of the substrate joining structure according to the third embodiment. In this case, the first substrate 2 (the component mounting substrate) and another first substrate 2 (the component mounting substrate) are connected to each other. It is also possible that a joining end portion 2b and first conductive lands 21 and first reinforcing lands 22 are newly provided to either end of two connected first substrates 2, and then connected to the second substrate 3. That is, as shown in FIG. 6, a joining end portion 2b is formed by the longitudinal end portions of two first substrates 2, and the first conductive lands 21 are formed near the joining end portion 2b on each of the component mounting surfaces 2a. Then, the joining end portion 2b of one first substrate 2 is placed overlapping the joining end portion 2b of the other first substrate 2, and the corresponding first conductive lands 21 of the two first substrates 2 are soldered and connected. In the case where the first reinforcing lands 22 are formed on both of the two first substrates 2, soldering the corresponding first reinforcing lands 22 of the two first substrates 2 and the first reinforcing lands 22 of the other first substrate 2 to connect each other allows for enforcing the connection strength in the case of additionally connecting the first substrate 2.

Fourth Embodiment

Figure 7:
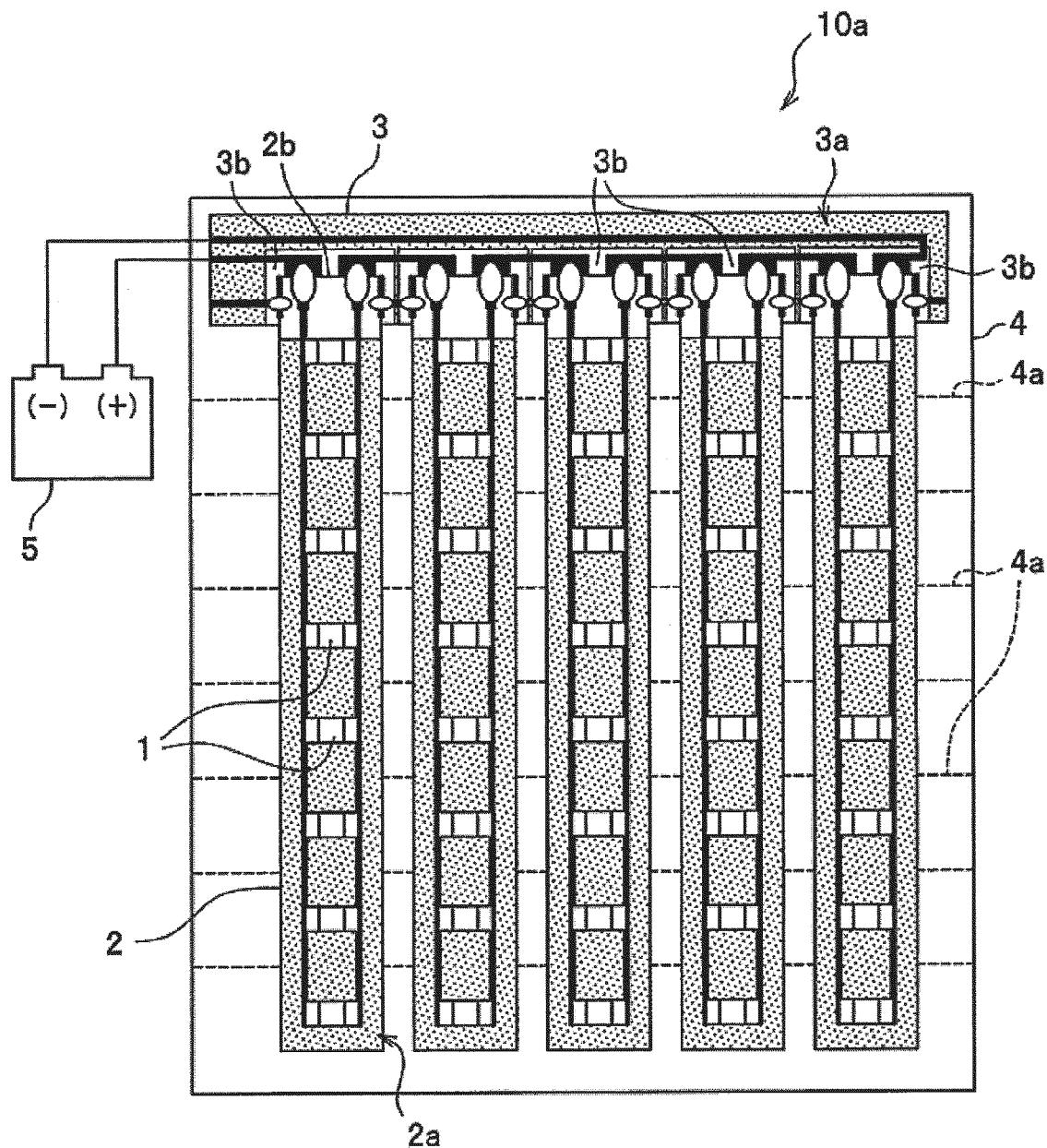
FIG. 7 is a diagram showing a light emitting device according to a fourth embodiment.

FIG. 7 is a diagram showing a light emitting device according to a fourth embodiment. A light emitting device 10a according to the fourth embodiment includes a configuration to reduce warpage caused by, for example, heat. As shown in FIG. 7, the reflecting plate 4 of the light emitting device 10a according to the fourth embodiment is provided with rows of small slits 4a that can reduce warpage of the reflecting plate 4 caused by heat. Note that, the light emitting device 10a according to the fourth embodiment is different from the light emitting device 10 according to the first to third embodiments (see FIG. 1A) in that rows of small slits 4a are formed in the reflecting plate 4, and other configurations are similar to that of the light emitting device 10 shown in FIG. 1A. Thus, detailed description other than the rows of small slits 4a will be omitted.

One row of small slits 4a in the reflecting plate 4 is formed in a perpendicular direction with respect to the longitudinal direction of the first substrate 2 so that the holes are spaced apart from one another and penetrating the reflecting plater 4. Further, one row of small slits 4a is formed across the reflecting plate 4 from one end to the other. The rows of small slits 4a are formed at appropriate locations (i.e., between the light emitting elements 1) to avoid the light emitting elements 1 mounted on the first substrates 2. The rows of small slits 4a are preferably formed corresponding to intermediate locations between each adjacent two light emitting elements 1 on one first substrate 2 so that the light emitting elements 1 are not mounted above any slits 4a. It is also preferable that plural of the small slits 4a are formed corresponding to the locations between adjacent two light emitting elements 1 on one first substrate 2, which is assumed to enhance effect of thermal separation through the slits 4a. Further, in the fourth embodiment, the rows of small slits 4a are preferably formed in parallel to each other, so that ease can be provided to arrange the light emitting elements 1 mounted on the respective first substrates 2 at nearly uniform relative distances to the corresponding rows of small slits 4a. Further, the rows of small slits 4a are preferably formed substantially in parallel or perpendicular with respect to the corresponding sides of the reflecting plate 4, so that ease can be provided to arrange the light emitting elements 1 mounted on the respective substrates 4 at nearly uniform relative distances to the corresponding rows of small slits 4a or to the corresponding sides of the reflecting plate 4. For example, the rows of small slits 4a may extend at predetermined angles (e.g., 45°) relative to the sides of the reflecting plate 4. The rows of small slits 4a may be formed in a honeycomb pattern. That is, the reflecting plate 4 may be provided with the rows of small slits 4a arranged in a plurality of adjacent hexagons. Also, the rows of small slits 4a may be formed in straight line shapes or in any other appropriate shapes such as in curved line shapes such as circular shapes or arc shapes, or in a combination of straight lines and curved lines.

Note that, the rows of small slits 4a are preferably provided at the positions avoiding the light emitting elements 1 mounted on the first substrates 1. That is, the rows of small slits 4a are preferably provided so as not to cross the positions where the light emitting elements 1 are disposed.

In each rows of small slits 4a, the interval of the adjacent small holes, and the length and width of each hole can be appropriately arranged according to the strength required for the light emitting device 10 (the reflecting plate 4), and within a range where insulation of the first substrates 2 can be secured. The number of holes in each row of small slits 4a can be determined as appropriate. Also, the rows of small slits 4a may be substantially the same size or may be different in different rows. Further, in the case where a plurality of rows of small slits 4a are formed, the distance between two adjacent rows of small slits 4a may be the same or different.

For example, in the case of using the reflecting plate 4 made of PET and the first substrates 2 having the base member made of polyimide, the reflecting plate 4 has a thermal expansion coefficient greater than that of the first substrates 2. Accordingly, when heat generated by a driving circuit or the like is applied on the light emitting device 10 (FIG. 1A) according to the first embodiment that includes the reflecting plate 4 absence of the rows of small slits 4a, dimensional changes occur differently in the reflecting plate 4 and the first substrates 2, which may result in warpage of the light emitting device 10. Meanwhile as shown in FIG. 7, when the heat is applied to the reflecting plate 4 provided with the rows of small slits 4a, the reflecting plater 4 expands widening the holes 4a, so that overall dimensional change of the reflecting plate 4 can be reduced, and thus, occurrence of warpage in the light emitting device 10a can be reduced. In the case of a configuration absence of the rows of small slits 4a, when the heat is applied, the temperature of the reflecting plate 4 at the side that is provided with a plurality of the light emitting elements 1 becomes higher than that of the opposite side, so that there is a tendency of occurrence of upward warpage of the reflecting plate 4 as a whole, with the side of the reflecting plate 4 having the light emitting elements 1 warped upward. Meanwhile, it is thought that with the rows of small slits 4a, the reflecting plate 4 can be thermally divided into smaller units, so that overall warpage can be reduced. As described above, the portions of the reflecting plate 4 with the rows of small slits 4a tend to have larger degree of extension-contraction and warpage than other portions caused by repetitive ON-OFF operation of the light emitting device. Accordingly, providing the rows of small slits 4a to avoid the locations corresponding to the locations of the light emitting devices 1 mounted on the first substrate allows for a reduction in occurrence of detachment of the light emitting devices 1 from the component-side conductive portions 20. With the light emitting device 10a according to the fourth embodiment, even when the light emitting device 10a is placed at high-temperature and high-humidity places, or heated or dried, a warp can be effectively suppressed.

Fifth Embodiment

Figure 8A:
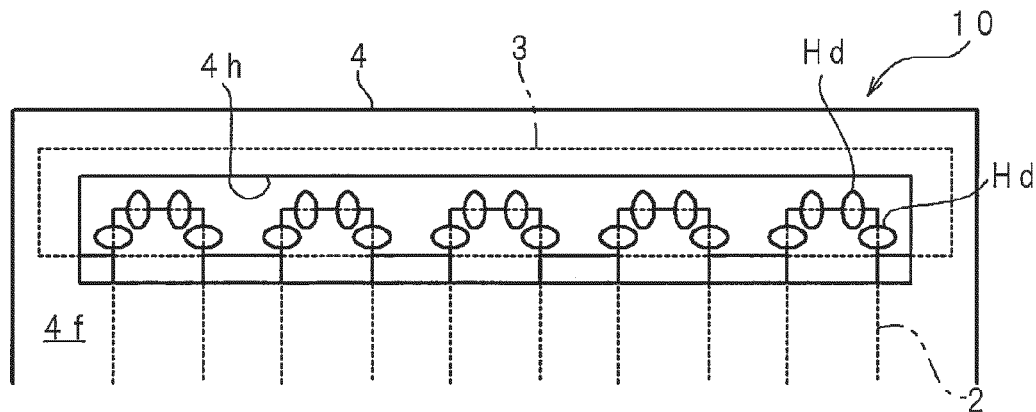
FIG. 8A is a diagram showing an example of a configuration of an opening formed in a surface of a reflecting plate.
Figure 8B:
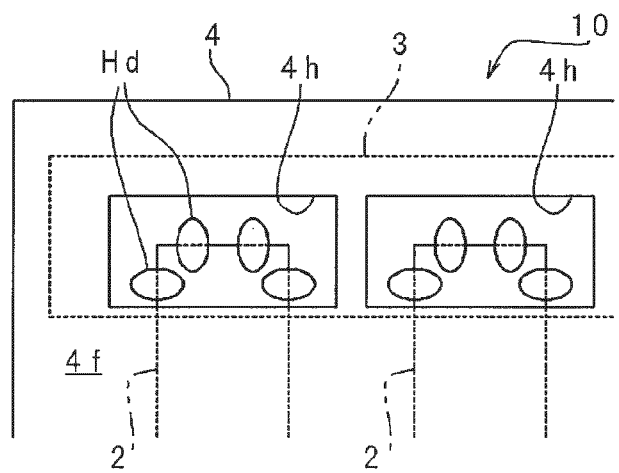
FIG. 8B is a diagram showing another example of a configuration of through holes formed in a surface of the reflecting plate.
Figure 8C:
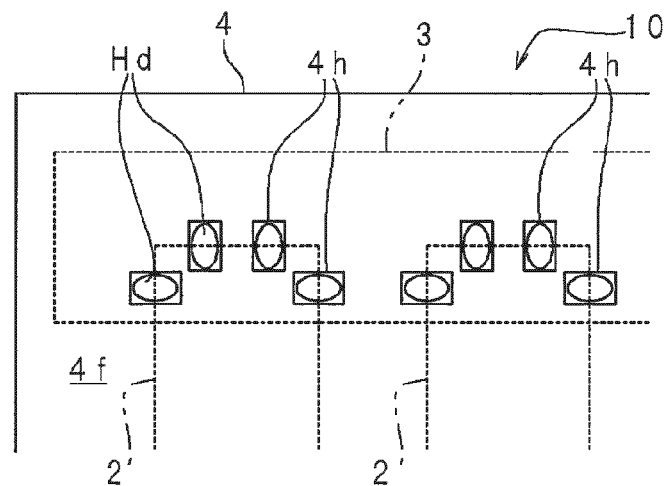
FIG. 8C is a diagram showing yet another example of a configuration of through holes formed in a surface of the reflecting plate.

FIG. 8A is a diagram showing a through hole defined in a surface of the reflecting plate. FIG. 8B is a diagram showing other form of the through holes defined in a surface of the reflecting plate. FIG. 8C is a diagram showing another form of the through holes defined in a surface of the reflecting plate. As shown in FIG. 1A, during the production of the light emitting device 10 in which the first substrates 2 and the second substrate 3 are disposed on the reflecting plate 4, in the case of connecting the first conductive lands 21 (see FIG. 4A) and the corresponding second conductive lands 31 (see FIG. 4A), respectively, by using solder member Hd (see FIG. 4A), the connecting portions may experience extremely high temperature. Also, in the case of connecting the first reinforcing lands 22 (see FIG. 4A) and the corresponding second reinforcing lands 32 (see FIG. 4A), respectively by using solder member Hd (see FIG. 4A), the connecting portions may also experience extremely high temperature.

Meanwhile, the reflecting plate 4 made of a resin material such as PET tends to melt at a high temperature. Such melting of the reflecting plate 4 by a high-temperature may generate fragments of the resin that adhere to the surface 4f of the reflecting plate 4 shown in FIG. 8A. The surface 4f of the reflecting plate 4 is to reflect the light from the light emitting element 1 (see FIG. 4A), so that adhesion of the fragments of the resin to the surface 4f of the reflecting plate 4 may lead a reduction in the light emitting performance of the light emitting device 10.

As shown in FIG. 8A, with the through hole 4h defined in the reflecting plate 4 at a location corresponding to the solder member Hd (the positions of the first conductive lands 21 and the second conductive lands 31 and the positions of the first reinforcing lands 22 and the second reinforcing lands 32 shown in FIG. 4A), while avoiding exposure of whole portion of the second substrate 3 from the through hole 4h, contact between the solder member Hd that may reach a high temperatures and the reflecting plate 4 can be avoided. Thus, melting of the reflecting plate 4 and resulting generation of fragments of the resin can be avoided. Accordingly, even in the light emitting device 10 that employs a configuration of having the first substrates 2 and the second substrate 3 disposed on the reflecting plate 4, the first substrates 2 and the second substrate 3 can be connected to each other by the solder member Hd without reducing the light emitting characteristics.

Note that, in the present embodiment, substantially rectangular through hole 4h is defined in the reflecting plate 4, but the through hole 4h can be formed with any appropriate shape and size. For example, as shown in FIG. 8A, one large through hole 4h may be defined so as to expose all the solder members Hd. Meanwhile, as shown in FIG. 8B, a plurality of through holes 4h may be defined in the reflecting plate 4a at locations corresponding to each single first substrate 2, such that one through hole 4h is defined to expose all the solder members Hd provided to a single first substrate 2. Also, as shown in FIG. 8C, one through hole 4h may be defined corresponding to each one of the solder members Hd. For example, four through holes 4h may be formed corresponding to four solder members Hd provided to a single first substrate 2. That is, it is preferable that each through hole 4h is defined corresponding to the location of each solder member Hd or to a location surrounding one or more solder members Hd, so that the influence of heat from the solder members Hd on the reflecting plate and be reduced and contact between the reflecting plate 4 and the solder members Hd can be avoided.

Note that, the configuration of the substrate joining structure included in the light emitting device according to the first to fifth embodiments can be changed as appropriate. For example, in the first embodiment as shown in FIG. 1A, the first substrates 2 connected to the second substrate 3 respectively haven a long rectangular shape (a belt shape). But the first substrates 2 that are connected to the second substrate 3 may have any appropriate shapes. With the use of the substrate joining structure according to the first embodiment and the substrate joining structure according to the second embodiment, the first substrates of various shapes such as a substantially rectangular shape (including a substantially square shape) or a substantially circular shape (including a substantially elliptical shape) can be connected to the second substrate 3.

Also, the substrate joining structure used in the light emitting device according to the first embodiment and/or the second embodiment can be used to connect a flexible substrate and a rigid substrate (i.e., a substrate made of a base material having a high rigidity). In this case, the flexible substrate can be connected to the rigid substrate by overlapping the flexible substrate on the rigid substrate and soldering from the flexible substrate side.

Also, the first substrates 2 may be a multilayer substrate (a substrate in which the first base member 20a includes layers of the component-side conductive portions 20 stacked in the first base member 20a), and/or the second substrate 3 may be a multilayer substrate (a substrate made of multilayers of a relay-side conductive member 30 are stacked each as a layer inside the second base member 30a). In the case where the first substrate 3 is a multilayer substrate, the first conductive lands 21 and the first reinforcing lands 22 are exposed at the component mounting surface 2a. In the case where the second substrate 3 is a multilayered substrate, the second conductive lands 31 and the second reinforcing lands 32 are exposed at the substrate joining surface 3a.

The electrically conductive joining member other than solder member Hd can be used as appropriate. For example, an electrically conductive adhesive agent may be used to connect (adhere) the first conductive lands 21 and the second conductive lands 31.

Also, the electronic components mounted on the first substrates 2 (see FIG. 1A) are not limited to the light emitting elements 1 (see FIG. 1A). For example, as the mounted electronic components, other electronic components such as transistors, resistors, capacitors, Zener diodes, bridge diodes, and fuses may be provided additionally to the light emitting element 1, or such other electronic components solely may be provided.

Further, each embodiment may include a configuration in which the substrate joining structure does not include the first reinforcing lands 22 (see FIG. 4A) and the second reinforcing lands 32 (see FIG. 4A).

Although the foregoing refers to particular preferred embodiments, it will be understood that the disclosure is not so limited. Various modifications may be made to the disclosed embodiments and that such modifications are intended to be within the scope of the disclosure. All of the publications, patent applications and patents cited herein are incorporated herein by reference in their entirety.

What is claimed is:

1. A light emitting device comprising:
   a substrate comprising:
      a flexible base member having an upper surface with a first lateral side, a second lateral side, a first longitudinal side, and a second longitudinal side, wherein the first and second longitudinal sides are longer than the first and second lateral sides,
      a first wiring pattern located on the upper surface of the base member, the first wiring pattern comprising:
         a first component-side conductive portion extending in a longitudinal direction from a location proximate the first lateral side of the upper surface of the base member, and
         a second component-side conductive portion extending in the longitudinal direction from a location proximate the first lateral side of the upper surface of the base member, and
      a plurality of reinforcing lands located on the upper surface of the base member, the plurality of reinforcing lands including:
         a first reinforcing land that, in a top view, (i) extends in the longitudinal direction from the first lateral side of the upper surface at a location between the first component-side conductive portion and the first longitudinal side of the upper surface, (ii) is spaced from the first component-side conductive portion in a lateral direction, and (iii) is closer to the first longitudinal side than to the first component-side conductive portion in the lateral direction, and
         a second reinforcing land that, in the top view, (i) extends in the longitudinal direction from the first lateral side of the upper surface at a location between the second component-side conductive portion and the second longitudinal side of the upper surface, (ii) is spaced from the second component-side conductive portion in the lateral direction, and (iii) is closer to the second longitudinal side than to the second component-side conductive portion in the lateral direction; and
   a plurality of light emitting elements mounted on the substrate, each light emitting element being electrically connected to the first component-side conductive portion and the second component-side conductive portion;
   wherein (i) a distance between the first component-side conductive portion and the second component-side conductive portion at the first lateral side of the upper surface of the base member is the same as (ii) a distance between the first component-side conductive portion the second component-side conductive portion at the light emitting elements.

2. The light emitting device according to claim 1, further comprising an insulating film that covers the first and second component-side conductive portions other than portion of the first and second component-side conductive portions proximate the first lateral side of the base member.

3. The light emitting device according to claim 2, wherein the insulting film comprises a white resist.

4. The light emitting device according to claim 1, wherein the base member comprises an insulating material selected from the group consisting of polyethylene terephthalate (PET), polyimide, or glass epoxy.

5. The light emitting device according to claim 1, wherein the substrate has a thickness in a range of 20 µm to 500 µm.

6. The light emitting device according to claim 1, wherein the plurality of light emitting elements are configured to emit light having the same color.

7. The light emitting device according to claim 1, wherein the plurality of light emitting elements are configured to emit light having different colors.

8. The light emitting device according to claim 1, wherein a portion of the first component-side conductive portion proximate the first lateral surface has an increased width so as to form a first conductive land, and a portion of the second component-side conductive portion proximate the first lateral surface has an increased width so as to form a second conductive land.

9. The light emitting device according to claim 4, wherein the substrate has a thickness in a range of 20 µm to 500 µm.

10. The light emitting device according to claim 2, wherein the base member comprises an insulating material selected from the group consisting of polyethylene terephthalate (PET), polyimide, or glass epoxy.

11. The light emitting device according to claim 2, wherein the substrate has a thickness in a range of 20 µm to 500 µm.

12. The light emitting device according to claim 2, wherein the plurality of light emitting elements are configured to emit light having the same color.

13. The light emitting device according to claim 2, wherein the plurality of light emitting elements are configured to emit light having different colors.

14. The light emitting device according to claim 2, wherein a portion of the first component-side conductive portion proximate the first lateral surface has an increased width so as to form a first conductive land, and a portion of the second component-side conductive portion proximate the first lateral surface has an increased width so as to form a second conductive land.

15. The light emitting device according to claim 3, wherein the base member comprises an insulating material selected from the group consisting of polyethylene terephthalate (PET), polyimide, or glass epoxy.

16. The light emitting device according to claim 10, wherein the substrate has a thickness in a range of 20 µm to 500 µm.

17. The light emitting device according to claim 15, wherein the substrate has a thickness in a range of 20 µm to 500 µm.

* * * * *